United States Patent [19]

Miyawaki et al.

[11] Patent Number: 5,040,151

[45] Date of Patent: Aug. 13, 1991

[54] MEMORY CIRCUIT WITH IMPROVED POWER INTERCONNECTIONS

[75] Inventors: Masahumi Miyawaki; Sanpei Miyamoto, both of Tokyo, Japan

[73] Assignee: Oki Electric Industry Co., Ltd., Tokyo, Japan

[21] Appl. No.: 644,988

[22] Filed: Jan. 23, 1991

[30] Foreign Application Priority Data

Jan. 23, 1990 [JP] Japan .......................... 2-12859

[51] Int. Cl.[5] .............................................. G11C 13/00
[52] U.S. Cl. ....................................... 365/226; 365/228
[58] Field of Search .................. 365/226, 227, 228; 371/66

[56] References Cited

U.S. PATENT DOCUMENTS 4,800,533 1/1989 Arakawa ........................... 365/226

Primary Examiner—Terrell W. Fears
Attorney, Agent, or Firm—Edward D. Manzo

[57] ABSTRACT

A memory circuit has a Vcc post that is connected to a Vcc pad and is optionally connectable to a mode pad. The memory circuit also has N data output buffers, M of which operate regardless of whether the Vcc post is connected to the mode pad or not. These M data output buffers are all powered from the Vcc pad. The remaining N−M data output buffers operate only when the Vcc post is connected to the mode pad; at least one of these N−M data output buffers is powered from the mode pad, thereby reducing the potential drop at the Vcc pad.

15 Claims, 3 Drawing Sheets

MEMORY CIRCUIT WITH IMPROVED POWER INTERCONNECTIONS

BACKGROUND OF THE INVENTION

This invention relates to a memory circuit capable of operation in two word configurations. More particularly, the invention relates to the power-line interconnections of the memory circuit.

The term "word configuration" refers to the number of data bits output simultaneously. A typical memory of this type has a first mode in which only one data bit is output at a time, and a second mode in which four or eight data bits are output at once. The mode is generally selected by an option such as a wire bonding option when the memory circuit is manufactured. Specifically, the memory circuit comprises a semiconductor chip having a mode pad that can be optionally connected to a power-supply (Vcc) post. The memory circuit operates in one mode if the mode pad is connected to the Vcc post, and in the other mode if the mode pad is not connected to the Vcc post.

The Vcc post is also connected to a Vcc pad on the semiconductor chip, which feeds power to data output buffers and various other circuits on the semiconductor chip. These other circuits include circuits that receive input signals at the transistor-transistor logic (TTL) level.

A problem with this memory circuit is that since all the data output buffers are powered from the Vcc pad, in the second mode of operation considerable charge and discharge current may flow through this pad, particularly when multiple "1" data bits are output. Due to the impedance of the bonding wire connecting the Vcc pad to the Vcc post, a large potential drop occurs at the Vcc pad. This in turn may lead to malfunctioning of the peripheral circuits powered from the Vcc pad, particularly to the malfunctioning of TTL input circuits. This problem has been difficult to solve.

SUMMARY OF THE INVENTION

It is accordingly an object of the present invention to avoid excessive potential drop at the Vcc pad.

A memory circuit capable of operation in a first mode for M-bit data output or a second mode for N-bit data output, M and N being positive integers with M less than N, comprises a Vcc post for application of power from an external power supply, a Vcc pad connected to the Vcc post, and a mode pad optionally connectable to the Vcc post. The mode pad is connected to the Vcc post when the memory circuit is used in the second mode, but not when the memory circuit is used in the first mode.

M data output buffers operable in both the first and second modes are connected to the Vcc pad and driven by power supplied from the Vcc post via the Vcc pad. One or more data output buffers operable in the second mode but not in the first mode are connected to the mode pad and driven by power supplied from the Vcc post via the mode pad.

DETAILED DESCRIPTION OF THE INVENTION

To illustrate the present invention a novel memory circuit will be described with reference to the drawings. The memory circuit will be a semiconductor random access memory (RAM) capable of both input (writing) and output (reading). They drawings show only one embodiment of the invention; they do not restrict the scope of the invention, which should be determined solely from the appended claims.

Figure 1:
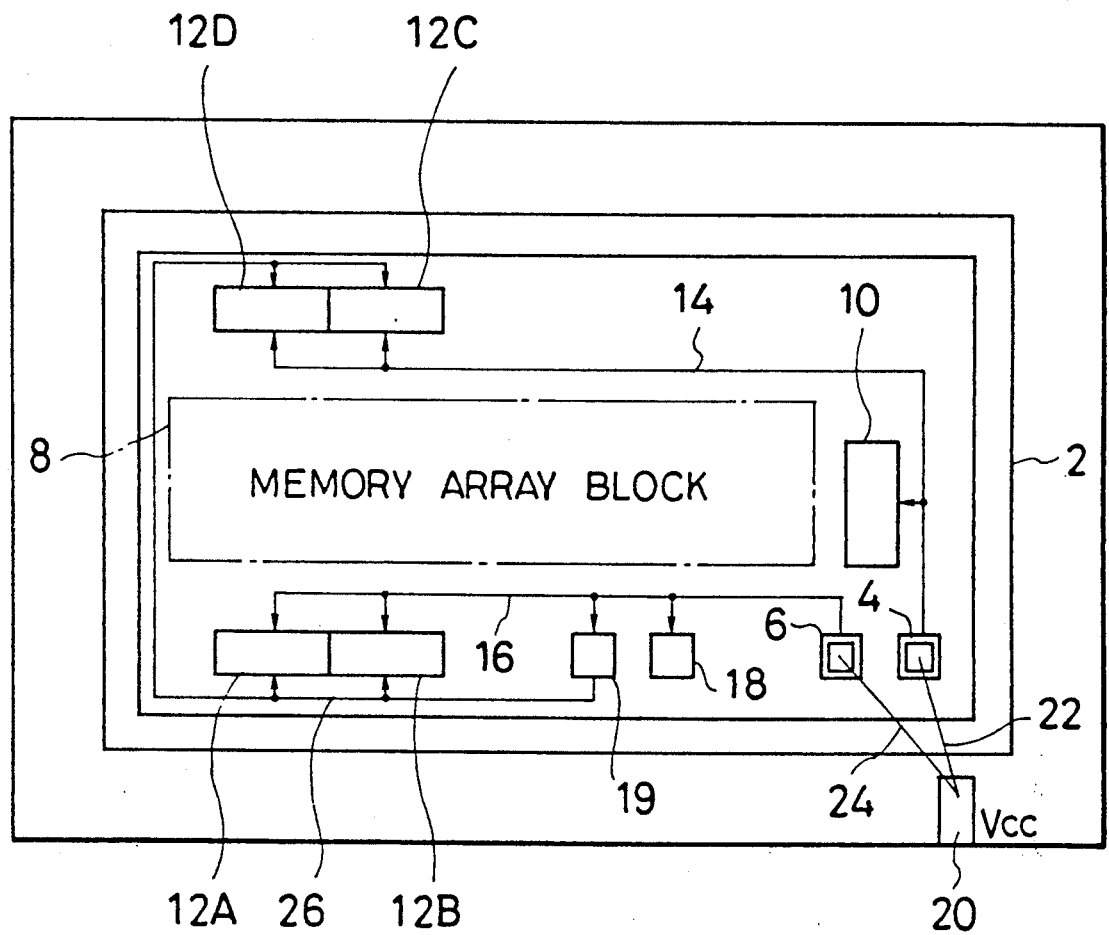
FIG. 1 illustrates the mode clamping circuit, switch circuit, and data output buffers of the invented memory circuit, and their power-line interconnections.

With reference to FIG. 1, a memory circuit comprises a semiconductor chip 2 on which are formed a Vcc pad 4, a mode pad 6, a memory array block 8, a peripheral circuit system 10, and data output buffers 12A to 12D. The peripheral circuit system 10 and data output buffers 12C and 12D are connected by a first Vcc line 14 to the Vcc pad 4. Data output buffers 12A and 12B are connected by a second Vcc line 16 to the mode pad 6.

The semiconductor chip 2 also has a clamping circuit 18 and a mode signal output circuit 19, which are connected by the second Vcc line 16 to the mode pad 6. The clamping circuit 18 clamps the mode pad 6 and the second Vcc line 16 to a first potential, more specifically to a ground potential (Vss), when external power is not applied to the mode pad 6.

The semiconductor chip 2 is mounted in a frame or package having a Vcc post 20 to which power at a second potential (Vcc) is supplied from an external source. The Vcc post 20 is connected by a wire 22 to the Vcc pad 4, and can be optionally connected by a wire 24 to the mode pad 6.

The mode signal output circuit 19 generates a mode signal having two states: a first state and a second state. The first state is assumed if the mode pad 6 is at the first (ground) potential. The second state is assumed if the mode pad 6 is at the second (Vcc) potential. The mode signal is sent to the data output buffers 12A to 12D via a signal line 26. The data output buffers 12A, 12B, and 12C operate when the mode signal is in the second state, but not when the mode signal is in the first state. The data output buffer 12D operates when the mode signal is in either the first or second state.

This memory circuit thus operates in one of two modes, as follows.

If the optional wire 24 is omitted so that the Vcc post 20 is not connected to the mode pad 6, the clamping circuit 18 clamps the mode pad 6 to the first (ground) potential and the mode signal output by the mode signal output circuit 19 is in the first state. The memory circuit accordingly operates in a first mode in which only the data output buffer 12D is active, and only one data bit is output at a time.

If the optional wire 24 is included, connecting the Vcc post 20 to the mode pad 6, then the mode pad 6 is at the second (Vcc) potential and the mode signal output by the mode signal output circuit 19 is in the second state. The memory circuit now operates in a second mode in which all four data output buffers 12A to 12D are active, and four data bits are output at a time.

The memory circuit also has four input buffers, not shown in FIG. 1, which are similarly controlled to provide one-bit input in the first mode and four-bit input in the second mode.

Figure 2:
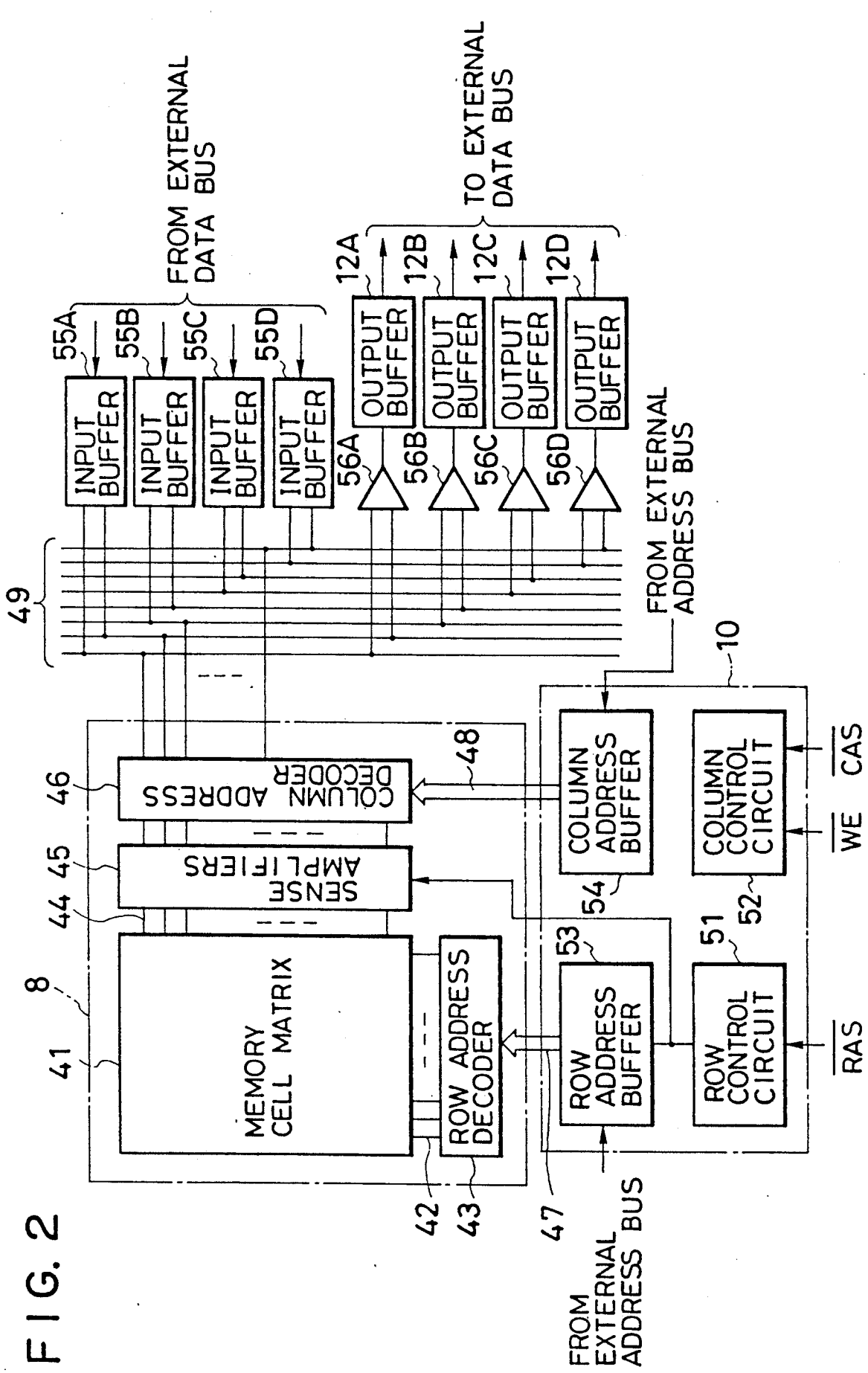
FIG. 2 is a schematic diagram illustrating the memory cell array, peripheral circuits, and data input and output buffers of the invented memory circuit.

FIG. 2 is a more detailed schematic circuit drawing showing the input buffers and further circuit elements. All elements shown in FIG. 2 are formed on the semiconductor chip 2 in FIG. 1. The Vcc pad 4, mode pad 6, first and second Vcc lines 14 and 16, clamping circuit 18, mode signal output circuit 19, Vcc post 20, wires 22 and 24, and signal line 26 in FIG. 1 are omitted from FIG. 2 for clarity.

With reference to FIG. 2, the memory array block 8 has a memory cell matrix 41 for storing data. A plurality of word lines 42 connect the memory cell matrix 41 to a row address decoder 43. A plurality of bit lines 44 connect the memory cell matrix 41 to sense amplifiers 45 and a column address decoder 46. The row address decoder 43 and the column address decoder 46 are connected to the peripheral circuit system 10 via a row address bus 47 and a column address bus 48, respectively. The column address decoder 46 is also connected to a data bus 49.

The peripheral circuit system 10 has a row control circuit 51 that inputs a row address strobe signal $\overline{RAS}$ and outputs a row timing signal, and a column control circuit 52 that inputs a write enable signal $\overline{WE}$ and a column address signal $\overline{CAS}$ and outputs a column timing signal. The row timing signal output from the row control circuit 51 is fed to a row address buffer 53 which latches a row address received from an external address bus not shown in the drawing, and is also connected to the sense amplifiers 45. The column timing signal output from the column control circuit 52 is output to a column address buffer 54 that latches a column address, also received from the external address bus. $\overline{RAS}$, $\overline{CAS}$, $\overline{WE}$, and theaddress signals received from the external bus are all TTL input signals.

Four data input buffers 55A to 55D and four bus amplifiers 56A to 56D are connected to the data bus 49. The bus amplifiers 56A to 56D are connected to respective data output buffers 12A to 12D. The data input buffers 55A and 55B and bus amplifiers 56A and 56B, like the data output buffers 12A and 12B, are driven by power supplied from the Vcc post 20 via the mode pad 6 in FIG. 1. The data input buffers 55C and 55D and bus amplifiers 56C and 56D, like the data output buffers 12C and 12D, are driven by power supplied from the Vcc post 20 via the Vcc pad 4 in FIG. 1.

Figure 3:
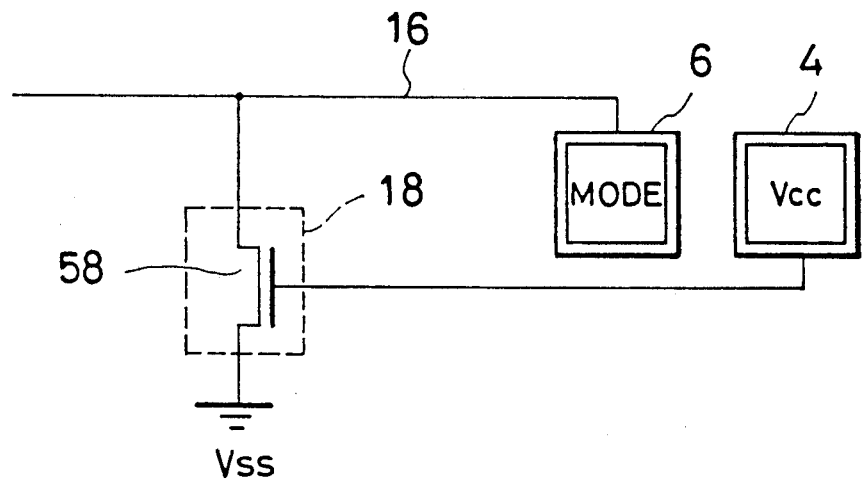
FIG. 3 is a schematic drawing of the clamping circuit in FIG. 1.

The data input buffers 55A to 55D in FIG. 3 latch data received from an external data bus, not shown in the drawings, and feed the latched data to the data bus 49. The bus amplifiers 56A to 55D receive data from the data bus 49 and amplify the received data to shorten the read access time of the memory circuit. The data output buffers 12A to 12D latch data received from bus amplifiers 56A to 56D and feed the latched data to the external data bus at TTL "0" and "1" levels.

The data input buffers 55A to 55C and bus amplifiers 56A to 56C, like the data output buffers 12A to 12C, operate when the mode signal from the mode signal output circuit 19 in FIG. 1 is in the second state but not when the mode signal is in the first state. The data input buffer 55D and bus amplifier 56D, like the data output buffer 12D, operate when the mode signal is in either the first or second state.

FIG. 3 is a more detailed drawing of the clamping circuit 18 in FIG. 1.

This clamping circuit 18 comprises an MOS transistor 58 of the n-channel type having an extremely small transconductance. The drain of the transistor 58 is connected via the second Vcc line 16 to the mode pad 6. Its gate is connected to the Vcc pad 4, and its source is connected to the ground potential (Vss).

The transistor 58 is always in the on state, and clamps the mode pad 6 and second Vcc line 16 to the ground potential Vss when the second potential (Vcc) is not applied to the mode pad 6. When Vcc is applied to the mode pad 6, due to its small transconductance, the transistor 58 has a comparatively small little effect on the potential of the mode pad 6, which is substantially equal to Vcc.

Figure 4:
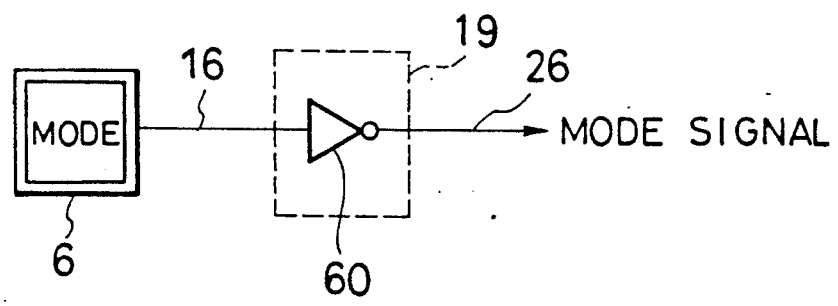
FIG. 4 is a schematic drawing of the mode switch circuit in FIG. 1.

FIG. 4 is a more detailed drawing of the mode signal output circuit 19 in FIG. 1.

The mode signal output circuit 19 comprises an inverter 60 that generates the mode signal by inverting the potential input from the mode pad 6. The first state of the mode signal is thus the high (Vcc) state, while the second state is the low (ground) state.

Next, the reading of data from the memory circuit in the first and second modes will be described.

In the first mode, in which the wire 24 is not connected, the mode pad 6 is clamped to the ground potential by the clamping circuit 18. This potential is inverted by the inverter 60 in FIG. 4 to generate a high mode signal, which activates the data input buffer 55D, the bus amplifier 56D, and the data output buffer 12D, but does not activate the data input buffers 55A to 55C, the bus amplifiers 56A to 56C, and the data output buffers 12A to 12C.

With reference again to FIG. 2, the peripheral circuit system 10 operates according to the $\overline{RAS}$, $\overline{CAS}$, and $\overline{WE}$ signals mentioned earlier. Specifically, the row address buffer 53 and the sense amplifiers 45 are activated by the timing signal output from the row control circuit 51 on, for example, the rise of $\overline{RAS}$. When the row address buffer 53 is activated it latches a first (row) address that is decoded by the row address decoder 43 to drive one of the word lines 42. Memory cells in the memory cell matrix connected to this word line 42 then output pairs of differential signals on the bit lines 44. These signals are amplified to the "0" or "1" logic level by the sense amplifiers 45.

Next, on a high-to-low transition of $\overline{CAS}$, for example, the column control circuit 52 activates the column address buffer 54, which latches a second (column) address. The column address decoder 46 decodes this address, selects one pair of differential signals output from the sense amplifiers 45, and sends that pair of differential signals via the data bus 49 to the bus amplifier 56D. The data output buffer 12D then outputs the corresponding TTL "0" or "1" signal. In this way one bit of data is output from the memory circuit.

In the second mode, the potential Vcc applied from the Vcc bonding post 20 to Vcc pad 4 in FIG. 1 is inverted by the mode signal output circuit 19 to generate a low mode signal, which activates all the data input buffers 55A to 55D, bus amplifiers 56A to 56D, and data output buffers 12A to 12D. The read operation is the same as in the first mode except that the column address decoder 46 now selects four pairs of differential signals output from the memory cell matrix 41 and feeds these via the data bus 49 to respective bus amplifiers 56A, 56B, 56C, and 56D. The data output buffers 12A, 12B, 12C, and 12D then output four corresponding TTL "0"

or "1" signals. In this way four bits of data are output simultaneously from the memory circuit.

With reference again to FIG. 1, let I be the total current flow generated by output of four "1" data bits. In the prior art all of this considerable current I flowed through the Vcc pad 4, leading to a large potential drop due to the impedance of the wire 22. This potential drop adversely affected the operation of the peripheral circuit system 10, particularly of its TTL-level input circuits. In the novel memory circuit, in which only the data output buffers 12C and 12D are driven from the Vcc pad 4, the current flowing through the Vcc pad 4 is only I/2 and the potential drop is correspondingly less. Malfunctions of the peripheral circuit system 10, which were a problem in the prior art, therefore tend not to occur in the novel memory circuit.

The operation of writing data to the novel memory circuit will not be described in detail because it is analogous to the read operation; also because potential drop due to current flow is not so much a problem in writing as in reading. The selection of the read or write operation is controlled by the write enable signal $\overline{WE}$.

The novel memory circuit can be modified in various ways without departing from the spirit and scope of the present invention. Possible modifications include, but are not limited to, the following.

In FIG. 1, the Vcc lines 14 and 16 were arranged so that half of the data output buffers were driven from the Vcc pad 4 and half from the mode pad 6. This arrangement of equal numbers may be particularly beneficial when there are a larger number of data output buffers. In FIG. 1, however, substantially the same benefit could be obtained by driving the data output buffers 12A to 12C that operate only in the second mode from the mode pad 6, and driving the data output buffer 12D that operates in both the first and second modes from the Vcc pad 4.

Other word configurations are possible. In general the total number of data output buffers can be any integer N greater than one. Of these, M data output buffers operate in both the first and second modes, where M is a positive integer less than N. These M data output buffers are all driven from the Vcc pad 4. The remaining N−M data output buffers operate only in the second mode. These N−M data output buffers can be driven from either the Vcc pad 4 or the mode pad 6, although at least one of them must and preferably at least N/2 should be driven from mode pad 6.

The interconnections between the Vcc bonding post 20, the Vcc pad 4, and the mode pad 6 need not be made by wires 22 and 23. Depending on the physical structure of the memory circuit, a metal layer, for example, might be used instead. In this case the first mode might be selected by, for example, cutting the interconnection between the Vcc post 20 and mode pad 6 with a laser during the fabrication process.

The layout of the Vcc pad 4, the mode pad 6, the peripheral circuit system 10, the data output buffers 12A to 12D, and the other components in FIGS. 1 and 2 can of course be modified in various ways.

The invention is applicable not only to random-access memories such as the one illustrated in FIG. 2 but to other types of memory as well, including read-only memories (ROM) which do not have data input buffers.

What is claimed is:

1. A memory circuit capable of operation in a first mode for M-bit data output or a second mode for N-bit data output, M and N being positive integers with M less than N, comprising:
   a Vcc post for application of power from an external power supply;
   a Vcc pad connected to said Vcc post;
   a mode pad optionally connectable to said Vcc post, said mode pad being connected to said Vcc post when the memory circuit is used in said second mode, but not connected to said Vcc post when the memory circuit is used in said first mode;
   M data output buffers operable in both said first mode and said second mode, connected to said Vcc pad and driven by power supplied from said Vcc post via said Vcc pad; and
   one or more data output buffers operable in said second mode but not in said first mode, connected to said mode pad and driven by power supplied from said Vcc post via said mode pad.

2. The circuit of claim 1, wherein equal numbers of data output buffers are connected to said Vcc pad and said mode pad.

3. The circuit of claim 1, wherein M=1, N=4, two data output buffers, comprising one data output buffer operable in both said first mode and said second mode and one data output buffer operable in said second mode but not in said first mode, are connected to said Vcc pad, and two data output buffers, both operable in said second mode but not in said first mode, are connected to said mode pad.

4. The circuit of claim 1, also comprising peripheral circuits connected to said Vcc pad and driven by power supplied from said Vcc post via said Vcc pad.

5. The circuit of claim 4, wherein said peripheral circuits comprise transistor-transistor logic.

6. A memory circuit comprising:
   a Vcc post for application of power at a first potential from an external power supply;
   a Vcc pad connected to said Vcc post;
   a mode pad optionally connectable to said Vcc post;
   a clamping circuit for clamping said mode pad to a second potential, different from said first potential, when said mode pad is not connected to said Vcc post;
   a mode signal output circuit, connected to said mode pad, for generating a mode signal having a first state if said mode pad is at said first potential and a second state if said mode pad is at said second potential;
   a first data output buffer connected to said Vcc pad and said mode signal output circuit, operable both when said mode signal is in said first state and when said mode signal is in said second state, and driven by power supplied from said Vcc post via said Vcc pad; and
   a second data output buffer connected to said mode pad and said mode signal output circuit, operable when said mode signal is in said second state but not operable when said mode signal is in said first state, and driven by power supplied from said Vcc post via said mode pad.

7. The circuit of claim 6, wherein equal numbers of data output buffers are connected to said Vcc pad and said mode pad.

8. The circuit of claim 6, also comprising:
   a third data output buffer connected to said Vcc pad and said mode signal output circuit, driven by power supplied from said Vcc post via said Vcc pad; and a fourth data output buffer connected to said mode pad and said mode signal output circuit, driven by power supplied from said Vcc post via said mode pad;

said third data output buffer and said fourth data output buffer both being operable when said mode signal is in said second state but not operable when said mode signal is in said first state.

9. The circuit of claim 6, wherein said second potential is a ground potential.

10. The circuit of claim 6, wherein said clamping circuit comprises an n-channel MOS transistor having:
a source electrode held at said second potential;
a drain electrode connected to said mode pad; and
a gate electrode held at said first potential, thus holding said transistor in an on-state.

11. The circuit of claim 6, wherein said mode signal output circuit comprises an inverter.

12. In operating a semiconductor memory circuit having an external power supply post and a first internal power supply pad coupled to the post, the memory being capable of a first normal mode of operation where M data bits are outputted at a time and a second normal mode of operation where N data bits are outputted at a time, N exceeding M, a method of reducing voltage drop on the power supply pad of the memory during second mode operation by:

providing a second internal pad coupled to the VCC post, and powering a first group of the memory circuits via the first power supply pad and a second group of the memory circuits via the second pad during second mode operation.

13. The method of claim 12 wherein said first group of circuits includes some but not all of the output buffers.

14. The method of claim 12 wherein said first group includes some but not all of the input buffers.

15. The method of claim 12 wherein said first group includes some of the input buffers and some of the output buffers, and wherein said second group includes others of the input buffers and output buffers.

* * * * *